United States Patent
Nishida et al.

(10) Patent No.: US 10,892,415 B2
(45) Date of Patent: Jan. 12, 2021

(54) DEPOSITION MASK, VAPOR DEPOSITION APPARATUS, VAPOR DEPOSITION METHOD, AND METHOD FOR MANUFACTURING ORGANIC EL DISPLAY APPARATUS

(71) Applicant: HON HAI PRECISION INDUSTRY CO., LTD., New Taipei (TW)

(72) Inventors: Koshi Nishida, Osaka (JP); Katsuhiko Kishimoto, Osaka (JP)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 164 days.

(21) Appl. No.: 16/083,856

(22) PCT Filed: Jul. 22, 2016

(86) PCT No.: PCT/JP2016/071622
§ 371 (c)(1),
(2) Date: Sep. 10, 2018

(87) PCT Pub. No.: WO2017/154234
PCT Pub. Date: Sep. 14, 2017

(65) Prior Publication Data
US 2019/0067580 A1 Feb. 28, 2019

(30) Foreign Application Priority Data

Mar. 10, 2016 (JP) ................. 2016-047210

(51) Int. Cl.
*H01L 29/08* (2006.01)
*H01L 51/00* (2006.01)
(Continued)

(52) U.S. Cl.
CPC ........ *H01L 51/0011* (2013.01); *C23C 14/042* (2013.01); *C23C 14/12* (2013.01);
(Continued)

(58) Field of Classification Search
CPC ....... C23C 14/042; C23C 14/12; C23C 14/24; C23C 14/50; H01L 51/0011; H01L 51/5012; H01L 51/56
(Continued)

(56) References Cited

U.S. PATENT DOCUMENTS

| 4,913,928 A * | 4/1990 | Sugita .................. C23C 16/511 |
| | | 118/723 MA |
| 4,963,921 A | 10/1990 | Kariya et al. |

(Continued)

FOREIGN PATENT DOCUMENTS

| JP | S60-186339 A | 9/1985 |
| JP | S61-294442 A | 12/1986 |

(Continued)

*Primary Examiner* — Caleb E Henry
(74) *Attorney, Agent, or Firm* — ScienBiziP, P.C.

(57) ABSTRACT

The present application provides a vapor deposition method, a deposition mask, and a vapor deposition apparatus that make it possible to reliably and uniformly separate the deposition mask in a short time after vapor deposition is performed using a vapor deposition material. In Step (S1), a deposition mask that at least partly has a metal layer (metal support layer) made of a ferromagnetic material is formed. In Step (S2), the metal layer of the deposition mask is magnetized by applying an electromagnetic field to the metal layer. In Step (S3), the deposition mask and a substrate are aligned with each other, and then the deposition mask is attracted and fixed to an electromagnet with the substrate) therebetween. In Step (S4), a vapor deposition source is disposed so as to face the deposition mask, and a vapor deposition material in the vapor deposition source is deposited on the substrate by vaporizing the vapor deposition material. In Step (S5), the electromagnet generates a magnetic field to cause the deposition mask to repel the electromagnet, thereby separating both the electromagnet and the substrate from the deposition mask.

7 Claims, 6 Drawing Sheets

(51) Int. Cl.
   *C23C 14/50*   (2006.01)
   *C23C 14/12*   (2006.01)
   *C23C 14/24*   (2006.01)
   *C23C 14/04*   (2006.01)
   *H01L 51/50*   (2006.01)
   *H01L 51/56*   (2006.01)

(52) U.S. Cl.
   CPC .............. *C23C 14/24* (2013.01); *C23C 14/50* (2013.01); *H01L 51/5012* (2013.01); *H01L 51/56* (2013.01)

(58) Field of Classification Search
   USPC .......................................................... 257/40
   See application file for complete search history.

(56) References Cited

U.S. PATENT DOCUMENTS

| | | | |
|---|---|---|---|
| 2002/0059903 A1* | 5/2002 | Hasegawa | C23C 14/042 118/504 |
| 2005/0166842 A1 | 8/2005 | Sakamoto | |
| 2006/0011136 A1* | 1/2006 | Yamazaki | C23C 14/12 118/719 |
| 2013/0199445 A1 | 8/2013 | Sonoda et al. | |
| 2015/0171329 A1 | 6/2015 | Yamazaki et al. | |
| 2015/0290667 A1* | 10/2015 | Mizumura | B05B 12/20 118/504 |
| 2018/0175124 A1* | 6/2018 | Seong | H01L 51/0011 |

FOREIGN PATENT DOCUMENTS

| | | |
|---|---|---|
| JP | H06-325929 A | 11/1994 |
| JP | 2008-024956 A | 2/2008 |
| JP | 2010-209441 A | 9/2010 |
| JP | 2011-195907 A | 10/2011 |
| JP | 2013-124372 A | 6/2013 |
| JP | 2013-253323 A | 12/2013 |

* cited by examiner

DEPOSITION MASK, VAPOR DEPOSITION APPARATUS, VAPOR DEPOSITION METHOD, AND METHOD FOR MANUFACTURING ORGANIC EL DISPLAY APPARATUS

TECHNICAL FIELD

The present invention relates to a deposition mask, a vapor deposition apparatus, a vapor deposition method, for example, which are used to vapor-deposit an organic layer in the organic electro-luminescence (EL) display apparatus, and a method for manufacturing an organic EL display apparatus. More specifically, the present invention relates to a deposition mask, a vapor deposition apparatus, a vapor deposition method, which make it possible to easily separate the deposition mask during vapor deposition, and a method for manufacturing an organic EL display apparatus.

BACKGROUND ART

For example, when an organic EL display apparatus is manufactured, a device substrate is formed by forming switching elements such as thin-film-transistors (TFTs) on a support substrate, and then organic layers are deposited on this device substrate in each of pixels. These organic layers are susceptible to moisture and thus cannot be etched. Thus, a deposition mask is disposed over the device substrate, and then an organic material is vapor-deposited on the device substrate via the deposition mask. In this way, the organic layers are selectively deposited on each of the pixels. As this deposition mask, a metal mask has been conventionally used. However, to form a deposition mask having a fine pattern of opening sections, a resin film instead of the metal mask, furthermore, a complex type deposition mask in which the resin film and a metal film are stacked to maintain a mechanical strength of the resin film, tends to be used. The metal layer is provided on a portion of a surface of the resin film.

When a deposition mask is used to deposit an organic material for an organic EL display apparatus, for example, the deposition mask is fixed with a so-called magnetic chuck method. More specifically, for example, the above metal mask or a metal support layer or a surrounding frame (frame body) of the complex type deposition mask is formed using a magnetic material, and is attracted and fixed to a permanent magnet or an electromagnet, with a device substrate to which the organic material is to be disposed therebetween (for example, refer to Patent Document 1). Then, after the deposition mask and the device substrate are aligned with each other, a vapor deposition material such as the organic material is sublimated or vaporized. The sublimated or vaporized deposition material passes through the deposition mask and deposited on the device substrate.

PRIOR ART DOCUMENT

Patent Document

Patent Document 1: JP 2013-253323 A

SUMMARY OF THE INVENTION

Problem to be Solved by the Invention

When the deposition mask and the device substrate are attracted and fixed to the magnet used in the magnetic chuck with above method, if the attractive force is too strong, the deposition mask may fail to be separated smoothly from the magnetic chuck after the vapor deposition. In a case where separating the deposition mask from the magnetic chuck is difficult, an overall manufacturing line may be stopped, which leads to a big trouble. It can be considered to make the magnetization of the deposition mask weak by using the electromagnet as the magnet. However, a strong attractive force may conversely act on the deposition mask, depending on a magnetization orientation of the deposition mask, thereby making the deposition mask more difficult to separate. When an organic material is sequentially deposited on a number of device substrates, it is a problem that a deposition mask may fail to be separated in a short time through a standard operation.

In the structure disclosed in Patent Document 1, the deposition mask is provided with protrusions in order to facilitate the separation of the deposition mask. Therefore, the deposition mask is in point contact with the substrate for vapor deposition (device substrate) on the electromagnet side. However, if a gap is created between the deposition mask and the substrate for vapor deposition, the organic material may be unable to be disposed on the substrate for vapor deposition with precise dimension, which can be a problem. As a result, an organic EL display apparatus manufactured in the above manner may fail to provide a high display quality. In addition to the above problem with the difficulty of the separation, a problem associated with alignment of the device substrate and the deposition mask may also arise. More specifically, when the deposition mask and the device substrate are aligned with each other, if the deposition mask is attracted strongly to the permanent magnet, precise alignment of the device substrate and the deposition mask may be difficult.

An object of the present invention, which solves problems as described above, provides a vapor deposition method, a deposition mask, and a vapor deposition apparatus that make it possible to reliably separate the deposition mask in a short time through a standard operation after depositing a vapor deposition material.

Another object of the present invention is to provide a method of manufacturing an organic EL display apparatus of high display quality by using the above vapor deposition method and the deposition mask.

Means to Solve the Problem

A vapor deposition method according to the present invention comprises: forming a deposition mask having at least partly a metal layer made of a ferromagnetic material; magnetizing the metal layer of the deposition mask by applying a magnetic field to the metal layer; aligning the deposition mask and a substrate for vapor deposition with each other, and then attracting and fixing the deposition mask to an electromagnet with the substrate for vapor deposition therebetween; depositing a vapor deposition material on the substrate for vapor deposition by vaporizing the vapor deposition material in a vapor deposition source, the vapor deposition source being disposed so as to face the deposition mask; and separating both the electromagnet and the substrate for vapor deposition from the deposition mask by generating a magnetic field to cause the deposition mask to repel from the electromagnet.

A vapor deposition apparatus according to the present invention comprises: an electromagnet; a substrate holder to hold a substrate for vapor deposition so as to be adjacent to one magnetic pole of the electromagnet; a deposition mask provided on an opposite side of the substrate for vapor deposition to the electromagnet, the substrate for vapor deposition being held by the substrate holder; and a vapor deposition source vaporizing a vapor deposition material, the vapor deposition source being provided so as to face the deposition mask, wherein the deposition mask has a metal layer made of a ferromagnetic material, and the electromagnet is connected to a control circuit capable of magnetizing the metal layer being included in the deposition mask.

A deposition mask according to the present invention is a deposition mask for use in forming a deposition layer on a surface of a substrate at a predetermined location, the deposition mask comprising: a metal layer formed in at least a portion of the deposition mask, the metal layer being made of a ferromagnetic material; and a resin film, on a portion of a surface of the resin film provided with the metal layer to constitute a complex type mask, wherein the metal layer possesses residual magnetization by being magnetized in a certain orientation.

A method for manufacturing an organic EL display apparatus according to the present invention is a method for manufacturing an organic EL display apparatus by depositing organic layers on a device substrate, the method comprising: forming the device substrate by forming at least a TFT and a first electrode on a support substrate; forming a deposition layer of the organic layers on the device substrate by depositing organic materials on the first electrode with the above-mentioned vapor deposition method; and forming a second electrode on the deposition layer.

Effects of the Invention

According to the vapor deposition method of the present invention, a metal layer (metal support layer) of the deposition mask, which is made of a ferromagnetic material, is magnetized. This deposition mask is attracted and fixed to a magnetic chuck together with a substrate for vapor deposition, and then the substrate for vapor deposition is vapor-deposited. After the vapor deposition, a direction of current fed through the magnetic chuck is controlled such that a magnetic field is generated in an orientation opposite to a magnetized orientation of the deposition mask. In this way, the deposition mask can be separated easily. Further, the deposition mask is always magnetized in a certain orientation. Thus, an electromagnet can uniformly and constantly apply a magnetic field in the opposite direction, thereby reliably separating the deposition mask and the substrate for vapor deposition from each other. As a result, a time for the vapor deposition is always stable in a manufacturing process, and a long time is not required for the separation. Consequently, it is possible to continue the process in a stable process working time (so-called tact time). Even when the substrate for vapor deposition and the deposition mask are aligned with each other, the electromagnet can weaken its magnetic field to suppress excessive attraction. This enables the substrate for vapor deposition to be finely moved, thereby facilitating the alignment between the substrate for vapor deposition and the deposition mask.

According to a vapor deposition apparatus of the present invention, an electromagnet provided in the vapor deposition apparatus has a control circuit that can magnetize a metal layer of a deposition mask. Thus, before or after the deposition mask is aligned with the vapor deposition apparatus together with the substrate for vapor deposition, the electromagnet can easily magnetize the metal layer. If the metal layer has already been magnetized before the deposition mask and the substrate for vapor deposition are aligned with and overlaid on each other, the electromagnet can, during the alignment, generate a magnetic field in an orientation opposite to a magnetized orientation of the metal layer, thereby weakening the attractive force.

According to the deposition mask of the present invention, the metal layer of the deposition mask is already magnetized in a certain orientation. The electromagnet in the vapor deposition apparatus can generate a magnetic field in the opposite direction, thereby easily separating the deposition mask and a substrate for vapor deposition from each other. In this case, since the deposition mask is magnetized in the certain orientation, the magnetic field generated in the opposite direction is also always constant. Therefore, the separation can be reliably made in a short time.

According to the method for manufacturing the organic EL display apparatus of the present invention, the deposition mask is always magnetized in a certain orientation. After vapor deposition, therefore, a process of separating the deposition mask and the electromagnet from each other is performed while an electromagnet is generating a magnetic field in an orientation opposite to the magnetized orientation of the deposition mask. In this way, the deposition mask and the electromagnet are easily separated from each other. Consequently, this method makes it possible to perform a vapor deposition process within a given time in any situation, in other words, to finish the vapor deposition process within a stable time, thereby contributing to achievement of cost reduction.

EMBODIMENT FOR CARRYING OUT THE INVENTION

Figure 1:
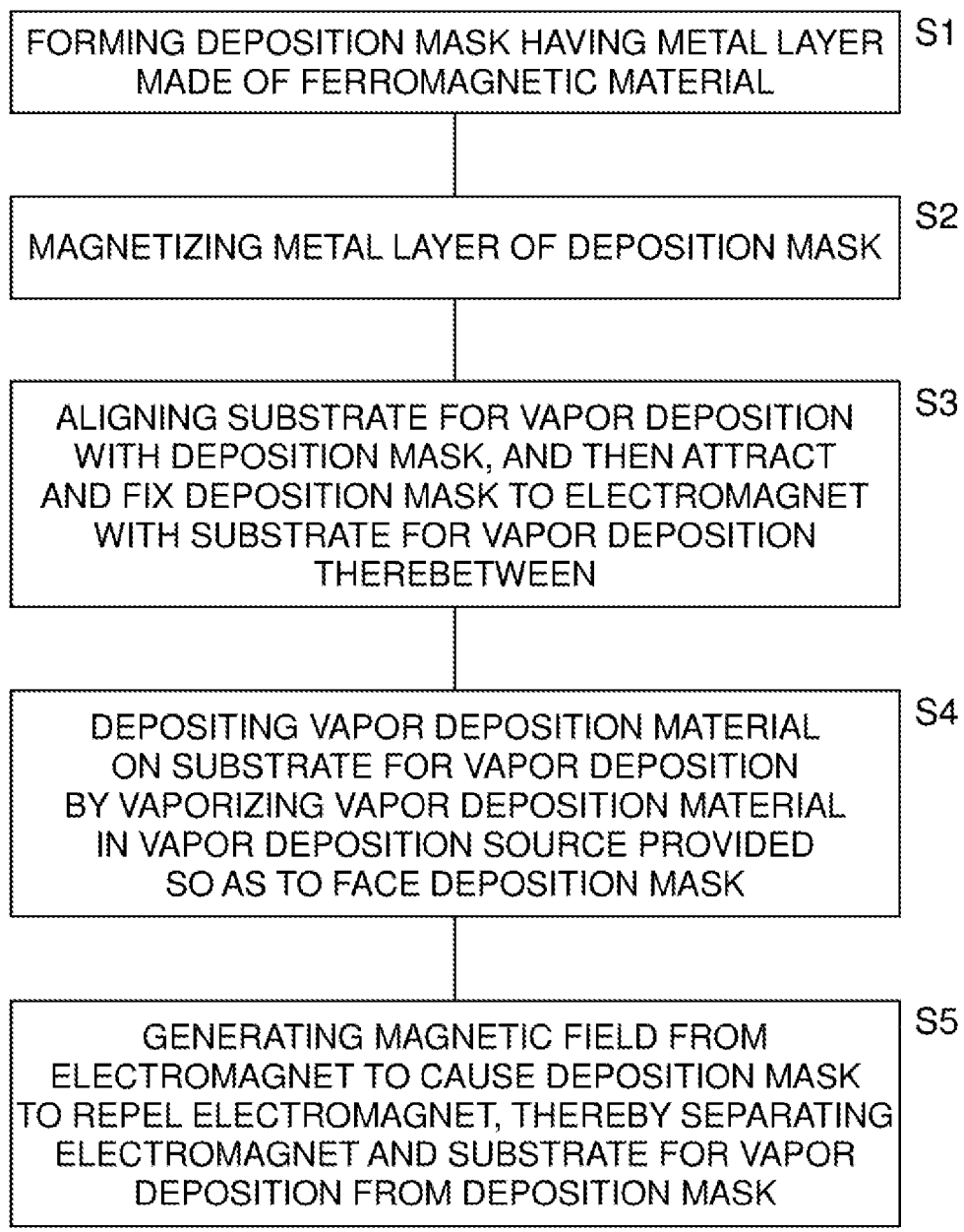
FIG. 1 is a flowchart of a vapor deposition method of the present invention.
Figure 2A:
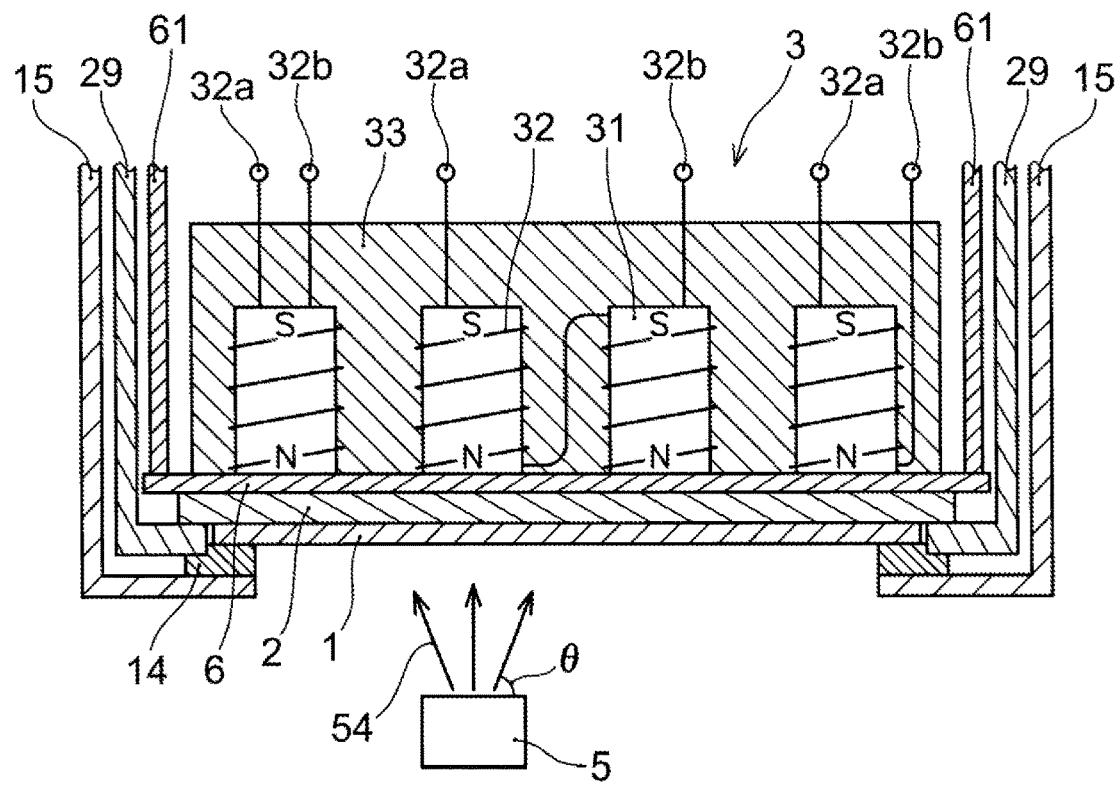
FIG. 2A schematically illustrates a cross section of a vapor deposition apparatus subjected to a vapor deposition method of the present invention.
Figure 2B:
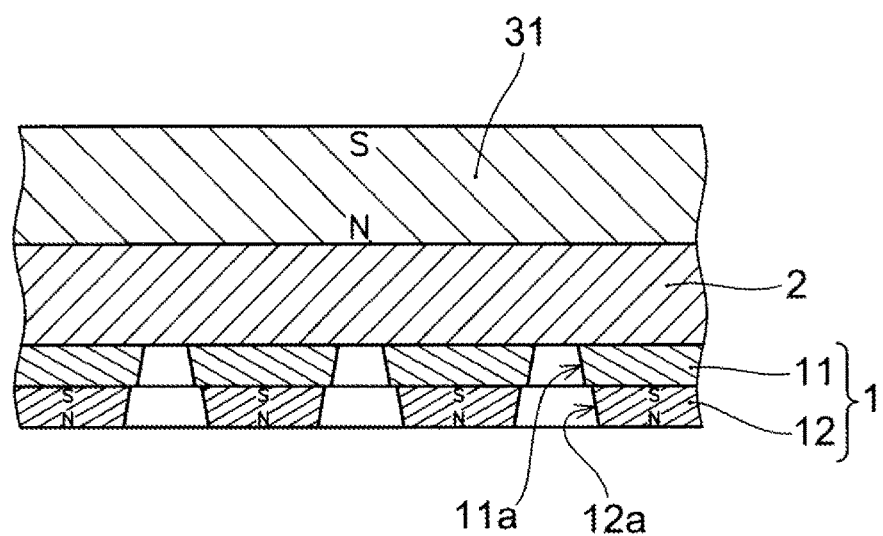
FIG. 2B is an explanatory diagram illustrating an enlarged cross section of the deposition mask in FIG. 2A.

With reference to the accompanying drawings, a description will be given of a vapor deposition method, a vapor deposition apparatus, and a deposition mask of the present invention. A process chart of an embodiment of the deposition method of the present invention is shown in FIG. 1, and a schematic view of a deposition apparatus for vapor deposition is shown in FIGS. 2A and 2B. As illustrated in FIGS. 1 to 2B respectively, the vapor deposition method comprising: forming a deposition mask 1 having at least partly a metal layer (metal support layer) 12 made of a ferromagnetic material (S1); magnetizing the metal layer 12 of the deposition mask 1 by applying a magnetic field to the metal layer 12 (S2); aligning the deposition mask 1 and a substrate 2 for vapor deposition with each other, and then attracting and fixing the deposition mask 1 to an electromagnet 3 with the substrate 2 for vapor deposition therebetween (S3); depositing a vapor deposition material on the substrate 2 for vapor deposition by vaporizing the vapor deposition material in a vapor deposition source 5, which is disposed so as to face the deposition mask 2 (S4); and separating both the electromagnet 3 and the substrate 2 for vapor deposition from the deposition mask 1 by generating a magnetic field to cause the deposition mask 1 to repel from the electromagnet 3 (S5). These steps do not necessarily have to be performed in this order. Alternatively, for example, the deposition mask may be magnetized after the deposition mask 1 and the substrate for vapor deposition are aligned with each other. When the electromagnet 3 attracts the deposition mask 1, current may be fed through the electromagnet 3 in such a way that the electromagnet 3 generates a magnetic field to attract the deposition mask 1. Alternatively, if the electromagnet 3 has magnetic core 31, the magnetic core 31 and the magnetized deposition mask 1 may be made to attract each other by setting current fed through the electromagnet 3 to zero (stopping the current).

Namely, the present invention has characteristics described below. The deposition mask 1 has at least the metal layer (metal support layer 12) made of a ferromagnetic material. The metal support layer 12 is magnetized and then attracted and fixed to a magnetic chuck. After that, vapor deposition is performed on the substrate 2 for vapor deposition. After the vapor deposition, the electromagnet 3 generates a magnetic field in an orientation opposite to a magnetized orientation of the deposition mask 1, thereby easily separating the deposition mask 1 and the electromagnet 3 from each other. Even when the metal support layer 12 is made of a magnetic material, if the metal support layer 12 is not magnetized previously, the metal support layer 12 is not in a magnetized state or not magnetized in a certain orientation. That is, in many deposition masks, their magnetic materials are in various magnetized states. Therefore, if the electromagnet uniformly generates a magnetic field, in some cases, this magnetic field repels a magnetic field generated by a deposition mask to facilitate the separate of the deposition mask. However, if a magnetic material of the deposition mask is not magnetized, an attractive force may act on the deposition mask. When the magnetized state of the deposition mask and the magnetic field generated by the electromagnet strengthen each other, the attractive force may further increase. In short, even when the electromagnet generates a uniform magnetic field, the deposition mask is not always separated easily. Individually changing a direction of current fed through the electromagnet may require a long time. Therefore, even if the electromagnet is used as the magnetic chuck, according to a deposition mask to be used a uniform process for separation may be obtained.

In short, conventional deposition mask has problems described below. Even if the metal layer is made of a magnetic material, a magnetized state is not uniform. When a permanent magnet is used and in an ease of attracting the deposition mask, a different attractive force is generated therebetween. Even if a magnetic chuck formed of electromagnet generates a magnetic field in an opposite direction in order to separate the deposition mask, the magnetic field in the opposite direction is not determined uniformly. Therefore, a long time may be required to separate the deposition mask, and the deposition mask may be deformed upon the separation. In the present invention, however, deposition mask is always magnetized in a certain orientation. Therefore, the electromagnet can uniformly apply the magnetic field in the opposite direction, thereby easily separating the deposition mask in a short time. Consequently, it is possible to perform vapor deposition in a constant, short tact time in mass production. Hereinafter, the vapor deposition methods of the present invention will be described in more detail by using some specific examples.

In Step (S1), the deposition mask 1 that at least partially has the metal layer (metal support layer 12) made of a ferromagnetic material is formed. The deposition mask 1 may be a metal mask; however, a complex type deposition mask having a structure in which the metal support layer 12 is laminated on a resin film 11 is exemplified as the deposition mask 1 in the example illustrated FIG. 2B. Because of recent scale-down of electronic components, a fine pattern of opening sections 11a is difficult to form on a metal mask. Therefore, the fine pattern of the opening sections 11a is formed on the resin film 11 that can be finely processed with relative ease. However, it is anxious that the resin film 11 alone is warped or bent. Thus, the deposition mask 1 has a complex type structure in which the metal support layer 12 is laminated on the resin film 11. In this case, the metal support layer 12 has openings 12a slightly larger in size than the opening sections 11a in the resin film 11. The deposition mask of the present invention has a characteristic in which the metal support layer 12, made of a ferromagnetic material, and is magnetized in a certain orientation. The resin film 11 and metal support layer 12 may be provided by forming the metal support layer 12 on the resin film 11 by means of sputtering, vacuum deposition, or electrolytic plating or the like, for example, or bonding a metal foil to the resin film 11. Alternatively, the resin film 11 may be laminated on metal support layer 12 by applying a liquid resin to a metal foil and curing the liquid resin.

The resin film 11 preferably has a linear expansion coefficient similar to that of the substrate 2 for vapor deposition; however, there is no specific limitation on a material of the resin film 11. Examples of the material of the resin film 11 include a polyimide (PI) resin, polyethylene naphthalate (PEN) resin, polyethylene terephthalate (PET) resin, cycloolefin polymer (COP) resin, cyclic olefin copolymer (COC) resin, polycarbonate (PC) resin, polyamide resin, polyamide-imide resin, polyester resin, polyethylene resin, polyvinyl alcohol resin, polypropylene resin, polystyrene resin, polyacrylonitrile resin, ethylene vinylacetate copolymer resin, ethylene-vinyl alcohol copolymer resin, ethylene-methacrylic acid copolymer resin, polyvinyl chloride resin, polyvinylidene chloride resin, cellophane, and ionomer resin. The polyimide resin is especially preferred, because its linear expansion coefficient can be adjusted in accordance with a condition such as a profile of a temperature rise in the heat treatment if the resin film is formed by applying a precursor solution and by subjecting the precursor solution to a heat treatment. However, the material of the resin film 11 is not limited to the polyimide resin. The resin film 11 may have a thickness of approximately several to several tens of micrometers, for example, 5 μm or more, 10 μm or less.

The metal support layer 12 may be made of a ferromagnetic material, examples of which include Fe, Co, Ni, an alloy thereof, an MnAl alloy, and SmCo as an intermetallic compound. The metal support layer 12 may be formed such that its thickness falls within a range of approximately 5 μm or more and 30 μm or less. The above ferromagnetic material preferably has a linear expansion coefficient similar to that of the substrate 2 for vapor deposition. Invar (alloy of Fe and Ni) is especially preferred because the thermal expansion is small.

For example, the metal support layer 12 is formed on a surface of the resin film 11 by means of an electrolytic plating, vacuum deposition, sputtering, or other film forming method. Then, regions of the metal support layer 12 around the opening sections 11a to be formed in the resin film 11 are removed by means of etching. Alternatively, the metal support layer 12 is formed by a lift-off method (if electrolytic plating is used, the metal support layer 12 is formed by the electrolytic plating after the pattern is formed with the resist film). In this way, the openings 12a that are slightly larger in size than the opening sections 11a in the resin film 11 are formed (see FIG. 2B). As an alternative example, a metal foil made of a ferromagnetic material may be bonded to the resin film 11, and then the openings 12a may be formed in the metal foil. As another alternative example, the resin film 11 may be formed by applying a liquid resin to a metal foil made of a ferromagnetic material and curing the liquid resin. Then, the metal foil may be etched to form the openings 12a whereby the metal support layer 12 is formed.

Figure 4A:
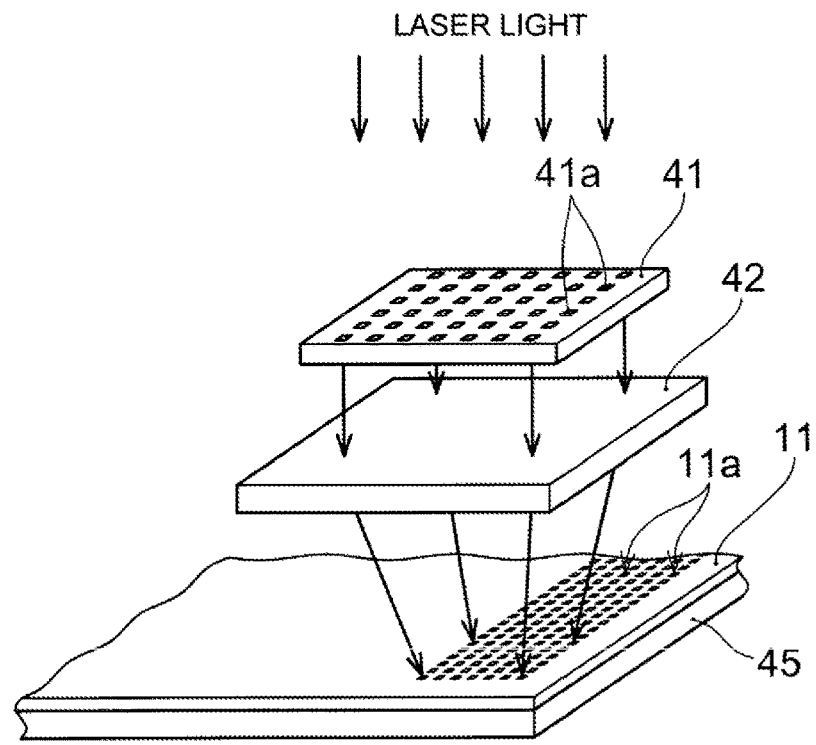
FIG. 4A is an explanatory diagram illustrating forming of opening sections in a deposition mask with laser light irradiation.

The opening sections 11a are formed in the resin film 11 with laser light irradiation. To form the opening sections 11a, as illustrated in FIG. 4A, for example, the resin film 11 on which the metal support layer 12 (not illustrated in FIG. 4A, see FIG. 2B) is formed is disposed on a process stage 45 with the metal support layer 12 facing upward. Then, the resin film 11 is irradiated with laser light via a laser mask 41 and an optical lens 42. The laser mask 41 has a desired pattern of opening sections 41a which conforms to the pattern of the opening sections 11a in the deposition mask 1. The optical lens 42 collects light. As a result of the laser light irradiation, the pattern of the opening sections 41a is transferred to the resin film 11 on a smaller scale. The opening sections 11a are thereby formed in the resin film 11. While being moved relative to the resin film 11 by a stepper, this laser light irradiation apparatus forms, step by step, the pattern of the opening sections 11a on the resin film 11 having a large size. The optical lens 42 may be optional but can effectively irradiate a processed surface with light having a high energy density. In this case, the optical lens 42 is positioned downstream of the laser mask 41 (between the laser mask 41 and the resin film 11) in a travel direction of the laser light. The optical lens 42 collects and condenses the laser light. For example, if the optical lens 42 has an optical magnification of ×10, the energy density of the laser light incident on the resin film 11 is 100 times as high as that incident on the optical lens 42, and the scale of a side of each of opening of the pattern of the opening sections 11a transferred to the resin film 11 is 1/10 times as large as that of the pattern of the opening sections 41a in the laser mask 41. As a result of the laser light irradiation, the laser light passes through the opening sections 41a in the laser mask 41 and then partly sublimates the resin film 11. In this way, a fine pattern of the opening sections 11a is formed on the resin film 11 in conformity with the pattern of the opening sections 41a in the laser mask 41 irradiated with the laser light and on the same scale as or a smaller scale than that of the pattern of the opening sections 41a. In this case, the opening 12a (see FIG. 2B) that is slightly larger in size than the opening section 11a in the resin film 11 is formed in the metal support layer 12 that is not illustrated in FIG. 4A (see FIG. 2B); therefore, the laser light is not blocked.

Although conditions for the laser light irradiation depend on, for example, a material and thickness of the resin film 11 to be processed and a size and shape of the opening sections 11a to be processed, under typical conditions, the pulse frequency of the laser light is a ranges of 1 Hz or more 60 Hz or less, the pulse width is a range of 3 ns or more and 15 ns or less, and the energy density per pulse on an irradiation surface is a range of 0.01 J/cm² or more and 1.00 J/cm² or less.

For example, suppose the deposition mask 1 is formed to deposit an organic layer in an organic EL display apparatus. For example, openings having a size of 60 μm per side are formed into a matrix shape and at intervals of approximately 60 μm. The resin film 11 made of polyimide and formed in the above manner may be irradiated with the laser light under the following conditions. The wavelength of the laser light is 355 nm (which is 1/3 of the wave length of YAG laser). The pulse frequency is 60 Hz. The pulse width is a range of 3 ns or more and 15 ns or less. The energy density on the irradiation surface is a range of 0.01 J/cm² or more and 1.00 J/cm² or less per pulse. The number of shots (the number of irradiated pulse) is a range of 50 or more and 200 or less (e.g., 100).

However, the laser light used for the irradiation is not limited to YAG laser. Any given laser light with a given wavelength, such as excimer laser light or He—Cd laser light, which is absorbed in resins, may be used. Obviously, the irradiation conditions need to be changed if another laser light source and resin material are used. If a polyimide film having a thickness of 10 μm is irradiated with 100 shots of laser light in order to form a pattern of opening sections thereon under the above conditions, complete through-holes are formed.

As illustrated in FIG. 2B, each of the opening sections 11a in the resin film 11 and the openings 12a in the metal support layer 12 has a tapered shape in which it is tapered so as to become small diameter toward the substrate 2 for vapor deposition. The reason why each of the opening sections 11a and the openings 12a is formed into the tapered shape is described as follows: the vapor deposition material in the vapor deposition source 5 (see FIG. 2A) is evaporated or sublimated to form a vapor deposition beam that spreads out at a certain angle θ defined by a shape of crucibles in the vapor deposition source 5, with its cross section having a fan shape (the vapor deposition source 5 is a linear vapor deposition source that has a line shape and extends in a direction perpendicular to the page of FIG. 2A, namely, a so-called linear source). Particles of the vapor deposition material in this beam even near the edge need to deposit on the substrate 2 for vapor deposition (see FIGS. 2A and 2B) at a desired location without a minimal risk of being blocked. The tapered shape can prevent blocking of vapor deposition particles in the vapor deposition beam near its edge. To form the opening sections 11a in the resin film 11 into the tapered shape, each opening section 41a in the laser mask 41 has different transmittances for the laser light at its center and on its periphery.

Figure 4B:
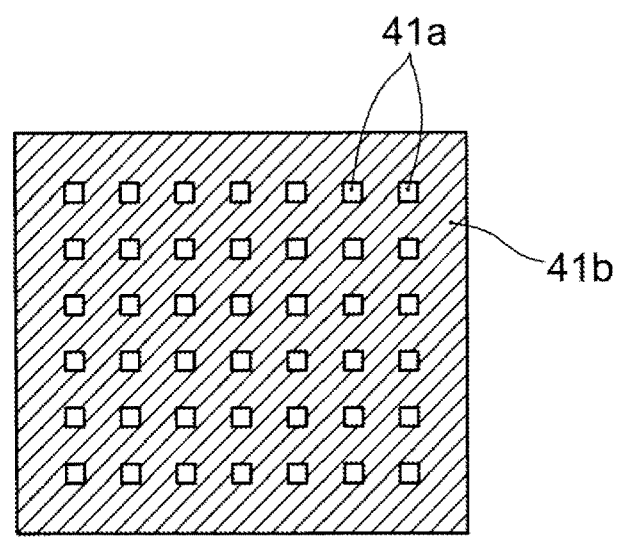
FIG. 4B is an explanatory diagram illustrating the forming of the opening sections in the deposition mask with the laser light irradiation.
Figure 4C:
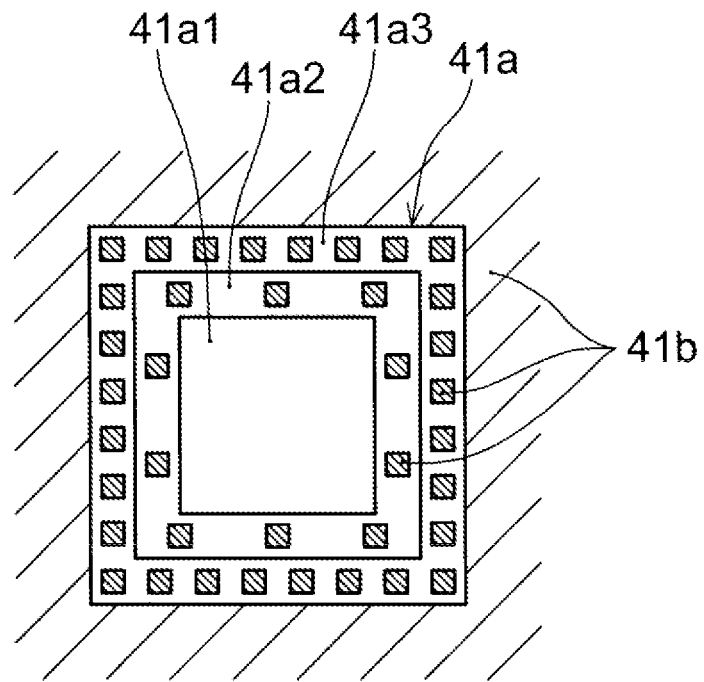
FIG. 4C is an explanatory diagram illustrating the forming of the opening sections in the deposition mask with the laser light irradiation.

For example, the above laser mask 41 may be formed by the following process. As illustrated in FIG. 4B, a light-shielding thin film 41b made of chromium, for example, is formed on a transparent substrate, such as a quartz glass plate, that transmits the laser light. Then, the light-shielding thin film 41b is patterned whereby the opening sections 41a are formed. Therefore, the light-shielding thin film 41b may be formed locally so as to vary the transmittance of each opening section 41*a*, for example, as conceptionally illustrated in FIG. 4C. Referring to FIG. 4C, each opening section 41*a* is constituted of a first section 41*a*1, a second section 41*a*2, and a third section 41*a*3; however, these sections are distinguished from one another for clarity and does not have to be distinguished. The first section 41*a*1 is a region where no light-shielding thin film 41*b* is formed and thus transmits 100% of the laser light. The second section 41*a*2 is a region where the light-shielding thin film 41*b* is partly formed so as to occupy approximately 20% of the entire area and thus has transmittance of approximately 80%. The third section 41*a*3 is a region where the light-shielding thin film 41*b* is partly formed so as to occupy approximately 50% of the entire area. As a result, the third section 41*a*3 has transmittance of approximately 50%. If the laser mask 41 is formed such that the transmittance of each opening section 41*a* varies more sharply from the center to the edge, each opening section 11*a* is tapered at a greater angle (the tapered shape is more similar to a vertical shape). If the laser mask 41 is formed such that the transmittance of each opening section 41*a* varies more gradually, each opening section 11*a* is tapered at a smaller angle (the tapered shape is more similar to a horizontal shape).

In the above example, the first section 41*a*1, the second section 41*a*2, and the third section 41*a*3 have been explained separately, and the light-shielding thin film 41*b* is formed dispersedly. However, an actual transfer resolution of the laser light is as low as approximately 2 µm. Therefore, if the area of one opening section 41*a* is divided horizontally and vertically into 25 segments each of which is 2 µm long per side, for example, the light-shielding thin film 41*b* may be formed within some of these segments. The transmittance of each opening section 41*a* for the laser light thereby can be adjusted. By adjusting the transmittance so as to continuously decrease from the center to the edge, each opening section 11*a* can be formed into a tapered shape.

After the opening sections 11*a* are formed in the above manner, the resin film 11 is separated from the process stage 45. Then, a tension is applied to the resin film 11 (the resin film 11 is expanded), and an unillustrated frame (frame body) is bonded to a periphery of the resin film 11. This frame may be welded to a portion of the resin film 11 around the metal support layer 12 with laser, for example, or may be bonded to the portion with a complete hardening adhesive agent that generates no gas, for example. In this case, laser openings may be formed after the frame is bonded, and this frame may be optional. In this way, the deposition mask 1 is manufactured.

In Step (S2), next, the metal support layer 12 (metal layer) in the deposition mask 1 is magnetized by applying a magnetic field to the metal layer 12. As indicated by a magnetization curve of FIG. 3B, for example, when an external magnetic field H applied to a ferromagnetic material increases, the magnetized strength (magnetic flux density) M of the ferromagnetic material also increases. However, when the external magnetic field H reaches or exceeds a given certain value, the magnetized strength M hardly increases and approaches a saturation magnetization M1. After that, when the external magnetic field H decreases to zero, a certain magnetization M2 emerges. The certain magnetization M2 is referred to as the residual magnetization (residual magnetic flux density). After this residual magnetization emerges, the ferromagnetic material acts as a magnet.

Figure 3A:
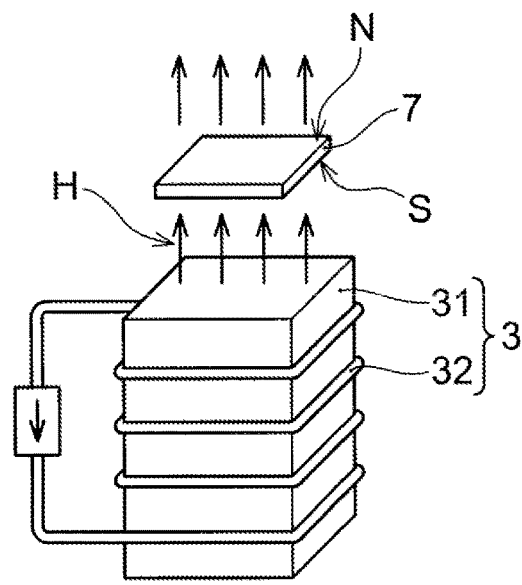
FIG. 3A is an explanatory diagram illustrating magnetizing of a ferromagnetic material with an electromagnet.

As illustrated in FIG. 3A, for example, each electromagnet 3 is created by winding an electrical wire around the magnetic core 31 to form an electromagnetic coil 32. When direct current flows through the electromagnetic coil 32 in an electromagnet 3, the electromagnet 3 generates a magnetic field H in accordance with the Ampere's right-handed screw rule. Then, when a ferromagnetic material 7 is placed within the magnetic field H, the magnetic field H induces the magnetization of the ferromagnetic material 7 in proportional to its strength, as described above. If the magnetic field H applied to the ferromagnetic material 7 reaches the saturation magnetization, the residual magnetization M2 is left in the ferromagnetic material 7 even after the magnetic field H decreases to zero. The strength of the magnetic field H is determined by the product of N and A (N×A), where N denotes the number of turns of the electromagnetic coil 32 around the magnetic core 31, and A denotes the amount of current fed through the electromagnetic coil 32. Thus, as the number N of turns of the electromagnetic coil 32 increases or as the current A increases, an electromotive force (N×A) obtained in the above manner increases. Here, a large amount of current may be fed to the electromagnetic coil 32 only momentarily, because the electromotive force (N×A) is independent of a time over which the current is fed through the electromagnetic coil 32. For example, electric charge accumulated in a capacitor may be drawn to the electromagnetic coil 32 rapidly, thereby obtaining a large amount of current. Therefore a magnetizing device may be a control circuit that includes a capacitor, as described above, and a discharge switch, and this control circuit may be connected to the electromagnetic coil 32 in the electromagnet 3.

In the present invention, since it is enough the residual magnetization may have some strength for the electromagnet 3 to attract and fix the deposition mask 1, the strengths of the saturation magnetization and residual magnetization of the magnetic material are not a big concern. Therefore, a typical ferromagnetic material, such as iron or nickel, may be magnetized in such a way that residual magnetization is left.

In Step (S3), the substrate 2 for vapor deposition and the deposition mask 1 are aligned with each other, and then the deposition mask 1 is attracted and fixed to the electromagnet 3 with the substrate 2 for vapor deposition therebetween. In this case, the deposition mask 1 is mounted on a mask holder 15, as schematically illustrated in FIG. 2A. Then, the substrate 2 for vapor deposition is carried by an unillustrated robot arm and mounted on a substrate holder 29, after which the substrate holder 29 is moved downward. In this case, the substrate 2 for vapor deposition and the deposition mask 1 are moved closer to each other until the substrate 2 for vapor deposition and the deposition mask 1 slightly make contact with each other, in other words, until alignment marks used for the alignment which are formed on the substrate 2 for vapor deposition and the deposition mask 1 can be observed simultaneously through an unillustrated image device. Then, a support frame 61 is moved downward whereby a touch plate 6 on which the electromagnet 3 is mounted is stacked on the substrate 2 for vapor deposition. While this state is being kept, the substrate 2 for vapor deposition and the deposition mask 1 are aligned with each other. After the alignment, the substrate 2 for vapor deposition is moved downward until the substrate 2 for vapor deposition completely makes contact with the deposition mask 1. During the alignment, the current is preferably fed through electromagnetic coil 32 in such a way that the attractive force decreases or disappears, in order to suppress the electromagnet 3 from excessively attracting the deposition mask 1. In this case, it is preferred that the electromagnet 3 applies the magnetic field to weaken the attraction between the electromagnet 3 and the deposition mask 1 so as not to over-attract, or to flow a current so as to repel each other. In this case, applying the magnetic field to completely repel between the deposition mask 1 and the electromagnet 3 is not preferred, because when the electromagnet 3 attracts the deposition mask 1 after the alignment, the deposition mask 1 may be displaced.

The above alignment of the substrate 2 for vapor deposition and the deposition mask 1 is performed by moving the substrate 2 for vapor deposition relative to the deposition mask 1 while the alignment marks used for the alignment which are formed on the substrate 2 for vapor deposition and the deposition mask 1 are being observed through the image device. This method makes it possible to align the opening sections 11a in the deposition mask 1 with a deposited area of the substrate 2 for vapor deposition (e.g., a pattern of first electrodes on a device substrate if the organic EL display apparatus described below is manufactured). After the alignment is performed, the current fed through the electromagnetic coil 32 is set to zero or the current is fed in a direction that causes the electromagnet 3 to attract the deposition mask 1. As a result, the electromagnet 3 and the deposition mask 1 attract each other by means of a strong attractive force and are firmly fixed to each other. If the electromagnet 3 has the magnetic core 31, the magnetic core 31 and the metal support layer 12, made of a ferromagnetic material, in the deposition mask 1 attract each other without having to feed the current through the electromagnetic coil 32. However, if the electromagnet 3 does not have the magnetic core 31, the current needs to be fed through the electromagnetic coil 32 in a direction that causes the electromagnetic coil 32 to attract the deposition mask 1. The electromagnetic coil 32 thereby attracts the deposition mask 1 by means of a strong attracting force. If the metal support layer 12 in the deposition mask 1 is not yet magnetized, a large amount of current is fed through the electromagnetic coil 32 at the time when the alignment is finished. This can magnetize the metal support layer 12 made of a ferromagnetic material so that the electromagnetic coil 32 attracts the deposition mask 1 without involving any additional process. Furthermore, if the metal support layer 12 in the deposition mask 1 is not yet magnetized, a small amount of current may be fed through each electromagnetic coil 32 so that the electromagnet 3 generate a weak magnetic field. In this case, the alignment is performed while the electromagnet 3 is weakly attracting the deposition mask 1.

As described above, the deposition mask 1 does not necessarily have to be magnetized before the deposition mask 1 is arranged on the substrate 2 for vapor deposition. Alternatively, after the substrate 2 for vapor deposition and the deposition mask 1 are aligned with each other while maintaining adjacent to a pole face of the electromagnet 3, the electromagnet 3 may magnetize the metal support layer 12. In this case, if the electromagnet 3 has the magnetic core 31, when the current fed through the electromagnet 3 is set to zero after the magnetization, the attractive force is still active between the magnetic core 31 and the metal support layer 12. Therefore, the vapor deposition process can be continued while the electromagnet 3 is in a deactivated state.

In Step (S4), as illustrated in FIG. 2A, the vapor deposition source 5 is disposed so as to face the deposition mask 1, and then a vapor deposition material 54 in the vapor deposition source 5 is vaporized and deposited on the substrate 2 for vapor deposition. The vapor deposition source 5 may be of a line type source, for example, in which crucibles are arrayed in line, namely, the so-called linear source; however, the vapor deposition source 5 is not limited to the linear source. When the linear source is used as the vapor deposition source 5, the linear source is moved horizontally on the page of FIG. 2A. The substrate 2 for vapor deposition thereby can be subjected to the vapor deposition at one time even if the substrate 2 for vapor deposition has a large size. More specifically, by heating the vapor deposition source 5, the vapor deposition material in the crucibles is sublimated. This vapor deposition material is evaporated or sublimated into an atmosphere, then passes through the opening sections 11a in the deposition mask 1, and deposited on the substrate 2 for vapor deposition at a predetermined location. If the organic EL display apparatus is manufactured, for example, a plurality kind of deposition masks in which the opening sections 11a are formed in some different pixels may be formed, and a vapor deposition process may be repeatedly performed every time one deposition mask is replaced by another. In this way, organic layers are formed.

In Step (S5), the electromagnet 3 generate the magnetic field to cause the deposition mask 1 to repel the electromagnet 3 (feeding the current in a direction opposite to the flowing direction of the current during the magnetization), thereby separating the electromagnet 3 and the substrate 2 for vapor deposition from the deposition mask 1. In other words, in Step S5, current is fed through the electromagnet 3 in a direction opposite to the flowing direction of the current that imparts the magnetic property, illustrated in FIG. 2A, during the magnetization in Step S2. This causes the electromagnet 3 and the deposition mask 1 to repel each other. As a result, the deposition mask 1 is easily separated from the electromagnet 3 and the substrate 2 for vapor deposition. In this case, the electromagnet 3 do not need apply as strong a magnetic field as is applied for the magnetization. Therefore, a high-current generating circuit, such as that in a magnetizing device, is not required. Therefore, the separation can be made simply by feeding current in a direction opposite to the flow direction of the current during the magnetization of the electromagnetic coil 32. The magnetization of the deposition mask 1 is not completely removed. The deposition mask 1 is simply exposed to the magnetic field generated in an orientation opposite to that of its residual magnetization. Thus, when the current fed through the electromagnet 3 is set to zero, the residual magnetization M2 is still left without great attenuation. As a result, this deposition mask is already magnetized when used for the next vapor deposition. This means that, when the deposition mask is used for the next vapor deposition, Steps S1 and S2 in the flowchart illustrated in FIG. 1 are already finished.

Figure 3B:
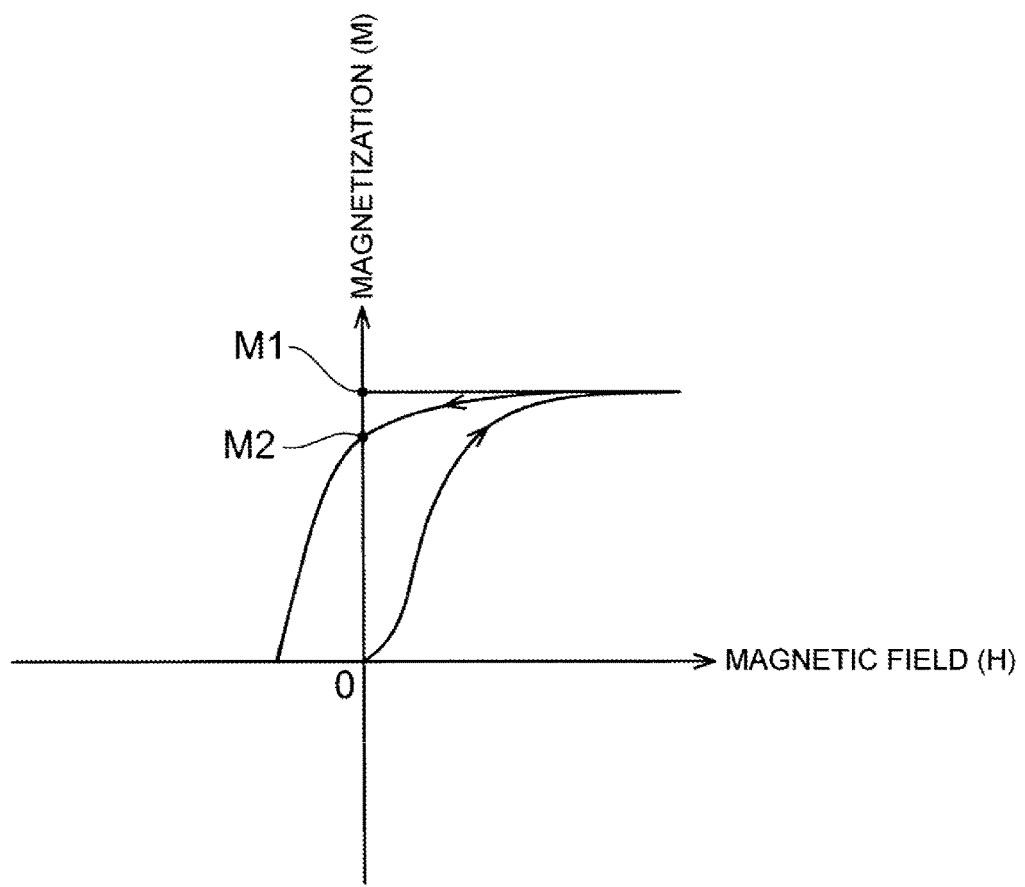
FIG. 3B is an explanatory diagram illustrating a magnetized state of the ferromagnetic material.

As described above, no problem will arise even when the deposition mask 1 is left magnetized. However, if the magnetization causes the deposition mask, to adsorb particles, such as dust particles, during washing, the magnetization of the metal support layer in the deposition mask 1 may be demagnetized by applying the magnetic field to repel the deposition mask 1 from the electromagnet 3 as described above. Demagnetizing the magnetization of the deposition mask 1, namely, setting the residual magnetization M2 to zero is difficult, because the magnetization property conforms to the hysteresis curve property as illustrated in FIG. 3B. In this case, the deposition mask 1 may be exposed to an alternating-current (AC) electromagnetic field while an alternating current is gradually decreased. In this way, the magnetization of the deposition mask 1 can be weakened. A control circuit used to demagnetize the magnetization includes: a circuit that feeds alternating current through electromagnetic coil 32; and an adjustment mechanism, such as a variable voltage transformer, for example, Slidax (variable transformer) that gradually decreases the alternating current. The electromagnet 3 is connected to a regulator circuit that acts as the control circuit that demagnetize the magnetization. This regulator circuit applies AC power to the electromagnetic coil 32 in the electromagnet 3 and adjusts the magnitude of this AC power.

As illustrated in FIG. 2A, a vapor deposition apparatus of the present invention includes: a electromagnet 3 mounted on the touch plate 6; the substrate holder 29 provided so as to be able to hold the substrate 2 for vapor deposition via the touch plate 6 on a side of magnetic poles of the electromagnet 3; the deposition mask 1 provided on an opposite side of the substrate 2 for vapor deposition held by the substrate holder 29 to the electromagnet 3; and the vapor deposition source 5 that is provided so as to face the deposition mask 1, and vaporizes the vapor deposition material. The deposition mask 1 has a metal layer (metal support layer 12, see FIG. 2B) made of a ferromagnetic material. The electromagnet 3 has a control circuit (not illustrated) that can magnetize the metal support layer 12 that the deposition mask 1 has. The deposition mask 1 is mounted on the mask holder 15. Both the substrate holder 29 and the touch plate 6 are movable upward. The substrate 2 for vapor deposition is carried by the robot arm (not illustrated) and placed on the substrate holder 29. Then, the substrate holder 29 is moved downward until the substrate 2 for vapor deposition to contact the deposition mask 1. After that, the support frame 61 is moved downward so that the touch plate 6 is stacked on the substrate 2 for vapor deposition. The touch plate 6 makes the substrate 2 for vapor deposition flat and has cooling water (not illustrated) that circulates inside to cool both the substrate 2 for vapor deposition and the deposition mask 1. A material and thickness of the touch plate 6 may be selected so that an in-plane distribution of a magnetic field on a deposition mask surface becomes uniform.

In the electromagnet 3, the electromagnetic coil 32 is wound around the magnetic core 31 made of, for example, an iron core, as illustrated in the schematic view of FIG. 3A. FIG. 2A is the structural image in which the deposition mask 1 has a size of approximately 1.5 m×1.8 m, and a plurality of electromagnets each of which has the magnetic core 31 having a size of approximately 20 cm per side, as illustrated in FIG. 3A, are arranged in accordance with the size of the deposition mask 1 (FIG. 2A is a horizontally scale-down drawing, and thus the illustrated electromagnets are fewer than actual ones). In the example illustrated in FIG. 2A, terminals 32a and 32b are formed on each of the electromagnets on both sides so that currents can be supplied independently to these electromagnets. However, the electromagnets in the middle are connected in series, and a terminal 32a is formed on the electromagnet at one end of the series connection, whereas a terminal 32b is formed on the electromagnet at the other end. This connection configuration aims to generate different repelling forces at the center and on the periphery. However, all the electromagnets may be connected in series. To generate different repelling forces at the center and on the periphery, the same amount of currents may be supplied to the electromagnets, by winding different numbers of turns of coils around the magnetic cores 31. In this case, all the electromagnets can be connected in series. Alternatively, all the electromagnets may be connected in series when magnetizing the deposition mask 1 and may be connected independently of one another when detaching the deposition mask 1.

When the electromagnets 3 generate different attractive forces at the center and on the periphery, for example, by setting the repelling force on the periphery to be greater than that at the center, the deposition mask 1 and the substrate 2 for vapor deposition can be easily separated from each other at their peripheral locations and then can be separated at their central location. If the first separation is made, the separation at the center can also be easily made. This configuration is advantageous when the substrate for vapor deposition is made of a film and manufactured, especially with a roll-to-roll process, because the substrate for vapor deposition can be easily detachable at the edge. In the example illustrated in FIG. 2A, the amounts of currents fed to the electromagnets differ only at the center and on the periphery. Alternatively, the central area may be further divided into a plurality of areas, and the electromagnets on the divided areas may generate different strengths of magnetic fields. In that case, the electromagnets can generate a magnetic field with its strength gradually varying from the periphery to the center. This varying strength can facilitate the separation between the substrate 2 for vapor deposition and the deposition mask 1 while reliably holding the substrate 2 for vapor deposition and the deposition mask 1.

In the example illustrated in FIG. 2A, the individual electromagnets are covered with and fixed by a resin 33, such as a silicone rubber, a silicone resin, or an epoxy resin. The resin 33 can fix the individual electromagnets to enhance their handleability although the resin 33 does not necessarily have to be used. Instead of being covered with the resin 33, alternatively, the electromagnets may be disposed so as to be exposed to the atmosphere and cooled down. A cooling device refers to a device that can perform such a cooling operation using gas or water. If large amount of current is fed through the electromagnet, the electromagnet may be heated. In that case, the above device preferably cools the electromagnet by using gas or water.

As illustrated in FIG. 2A, the mask holder 15 and the substrate holder 29 are provided in the vapor deposition apparatus. The substrate holder 29 is connected to an unillustrated driving device so as to hold the periphery of the substrate 2 for vapor deposition with a plurality of hook-shaped arms and to be movable vertically. The substrate 2 for vapor deposition is carried into the vapor deposition apparatus by the robot arm and is received by the hook-shaped arms. Then, the substrate holder 29 is moved downward until the substrate 2 for vapor deposition is in proximity to the deposition mask 1. In addition, an image device (not illustrated) is also provided for performing the alignment. The touch plate 6 is supported by the support frame 61, and the driving device is also provided to move the touch plate 6 until the touch plate 6 makes contact with the substrate 2 for vapor deposition. Downward moving of the touch plate 6 makes the substrate 2 for vapor deposition flat. A fine adjustment device is also provided to move the substrate 2 for vapor deposition relative to the deposition mask 1 during the alignment in which the image device is imaging the alignment marks formed on the deposition mask 1 arid the substrate 2 for vapor deposition. A current regulator is also provided to suppress the electromagnet 3 from excessively attracting the deposition mask 1 during the alignment. In this case, the current regulator decreases the attractive force or generates a magnetic field in an orientation that causes the attractive force to be cancelled out. The entire device illustrated in FIG. 2A is placed inside a chamber, and a device that evacuates air from the chamber is provided, although the chamber and the device are not illustrated.

The frame (frame body) 14, which is formed on the periphery of the deposition mask 1 as described above, is mounted on the mask holder 15. As described above, one detailed example of the structure of the deposition mask 1 is illustrated in FIG. 2B. The attractive force is generated between a magnetic pole of the magnetized metal support layer 12 and the magnetic core 31 in the electromagnet 3, and the magnetic core 31 attracts and fixes the deposition mask 1 with the substrate 2 for vapor deposition therebetween.

The vapor deposition source 5 may be any given vapor deposition source having a point, line, or plane shape. For example, the vapor deposition source 5 of the linear type (extends in a direction perpendicular to the page of FIG. 2A) in which crucibles are arrayed is moved from the left edge to right edge of the page. The entire surface of the substrate 2 for vapor deposition is thereby deposited. As described above, the vapor deposition source 5 emits the vapor deposition material as an emitted beam. A cross section of this emitted beam has a fan shape defined by a shape of the crucibles, and both sides of the cross section have a certain angle θ. To deliver, at a predetermined site of the substrate 2 for vapor deposition, particles of the vapor deposition material in the vapor deposition beam even near its edge which has the fan-shape cross section without being blocked by the metal support layer 12 and the resin film 11, each of the openings 12a in the metal support layer 12 and opening sections 11a in the resin film 11 is formed into a tapered shape. Alternatively, however, the openings 12a in the metal support layer 12 may also have a large, non-tapered shape.

As described above, the deposition mask of the present invention at least partly has the metal support layer (metal layer) made of a ferromagnetic material. The metal support layer 12 is formed on a portion of a surface of the resin film 11 to constitute the deposition mask 1. The metal support layer 12 is magnetized in a certain orientation so that residual magnetization is left.

Next, a method for manufacturing an organic EL display apparatus using the vapor deposition method of the present invention will be described. Any processes in the manufacturing method other than the vapor deposition method can be performed by the well-known methods. Thus, a method for depositing organic layers by the vapor deposition method of the present invention will be mainly described with reference to FIGS. 5A and 5B.

The method for manufacturing an organic EL display apparatus of the present invention includes: forming a device substrate 21 by forming TFTs (not illustrated), a planarizing layer, and first electrodes (for example, anodes) 22 on a support substrate (not illustrated); overlaying and aligning the deposition mask 1 manufactured with the above method on the device substrate 21; and forming a deposition layer 25 of organic layers by depositing the organic material 51. Then, a second electrode 26 (cathode) is formed on the deposition layer 25.

Figure 5A:
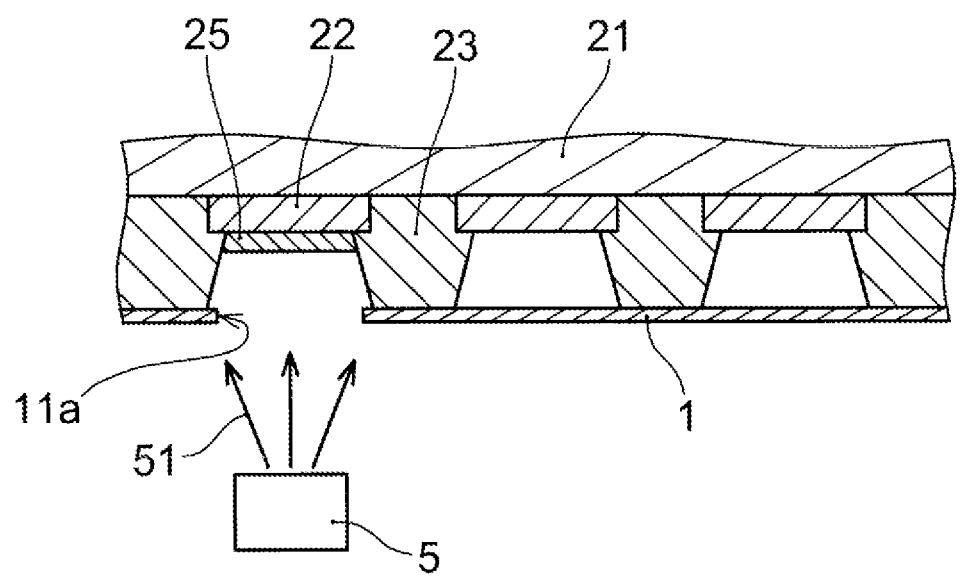
FIG. 5A is an explanatory diagram illustrating a vapor deposition process in the method for manufacturing an organic EL display apparatus of the present invention.
Figure 5B:
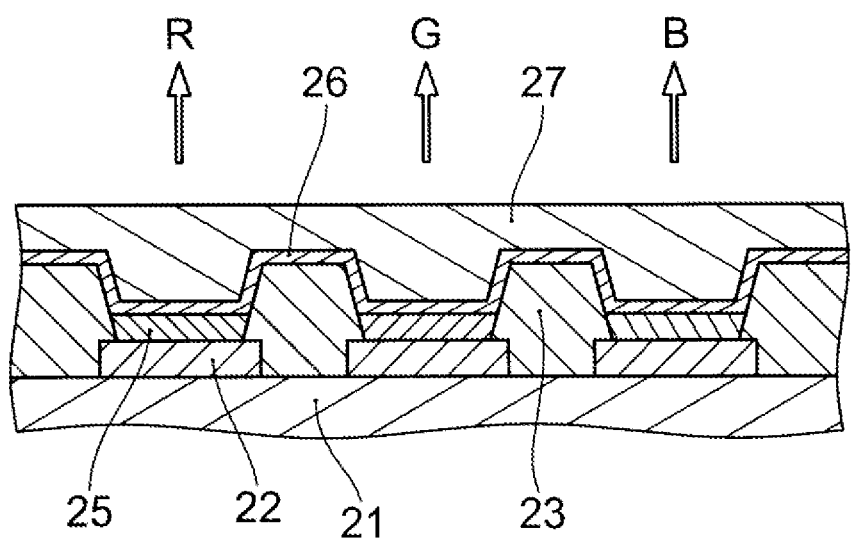
FIG. 5B is an explanatory diagram illustrating a process in which organic layers are deposited with the method for manufacturing the organic EL display apparatus of the present invention.

The device substrate 21 is formed by a process described below. For example, although not illustrated, switching elements, such as TFTs, are formed on a support substrate, such as a glass plate, in units of RGB sub-pixels in each pixel, and the first electrodes 22 connected to the switching elements are formed, on the planarizing layer, by a combination of a metal layer made of Ag or APC or the like, for example, and an ITO layer. As illustrated in FIGS. 5A and 5B, insulating bank 23 made of $SiO_2$, an acrylic resin, a polyimide resin, for example, are formed between the sub-pixels to divide the sub-pixels from each other. The above-mentioned deposition mask 1 is aligned with and fixed on the insulating banks 23 on the device substrate 21. As illustrated in FIG. 2A described above, the fixing is performed, for example, by using electromagnet 3, which is provided over the surface opposite to the vapor deposition surface of the device substrate 21, to attract the deposition mask 1. Since the metal support layer 12 in the deposition mask 1 is magnetized as described above, the deposition mask 1 is attracted to the magnetic core 31 in the electromagnet 3. If the electromagnet 3 does not have the magnetic core 31, the current is fed through the electromagnet 3 so as to generate the magnetic field in the same orientation as that of a magnetized state of the electromagnetic coil 32. The electromagnet 3 thereby attracts the deposition mask 1. In this case, the amount of the current may be small enough to generate the magnetic field. In this state, the opening section 11a in the deposition mask 1 and the first electrode 22 in the device substrate 21 are aligned with each other. The opening section 11a in the deposition mask 1 is formed so as to be smaller than a gap between opposed walls each other, of the insulating bank 23. Therefore, the organic material is suppressed from depositing to side wall of the insulating bank 23, thereby preventing lowered light emitting efficiency.

In the above state, as illustrated in FIG. 5A, the organic material 51 is evaporated from the vapor deposition source (crucibles) 5 in the vapor deposition apparatus, and then the organic material 51 is deposited only on parts of the device substrate 21 corresponding to parts of the deposition mask 1 in which the opening sections 11a are formed, so that the deposition layer 25 of the organic layers is formed on the first electrodes 22 in desired sub-pixels. Since the opening section 11a in the deposition mask 1 is formed such that the diameter is shorter than the gap between opposed walls each other of the insulating banks 23, as described above, the organic material 51 is less likely to be deposited on the side wall of the insulating banks 23. As a result, as illustrated in FIGS. 5A and 5B, the deposition layer 25 of the organic layers is basically deposited only on the first electrodes 22. This vapor deposition step may be performed on each sub-pixel by sequentially replacing one deposition mask 1 with another. A deposition mask may be used to deposit the same material on a plurality of sub-pixels at the same time. When the deposition mask 1 as described above is replaced with another, the electromagnet 3, not illustrated in FIG. 5A (see FIG. 2A), can generate a magnetic field to weaken the magnetization of the metal support layer 12 in the deposition mask 1, thereby easily separating the electromagnet 3 and the device substrate 21 from the deposition mask 1. A new deposition mask 1 may be placed in a manner similar to that performed in the first step.

FIGS. 5A and 5B each simply illustrate the deposition layer 25 of the organic layers by a single layer, but in fact the deposition layer 25 of the organic layers may be formed of the deposition layers 25 of a plurality of layers made of different materials. For example, a hole injection layer is provided as a layer in contact with the anode 22 in some cases. The hole injection layer improves a hole injection property and is made of material having a good ionization energy matching. A hole transport layer is formed of, for example, an amine-based material on the hole injection layer. The hole transport layer improves stable transportability of holes and enables confinement of electrons (energy barrier) into a light emitting layer. Further, the light emitting layer, which is selected depending on a target emission wavelength, is formed on the hole transport layer, for example, by doping red or green organic phosphor material into $Alq_3$, for the red or green wavelength. As a blue-type material, a bis(styryl)amine (DSA)-based organic material is used. An electron transport layer is formed of $Alq_3$, for example, on the light emitting layer. The electron transport layer improves an electron injection property and stably transports electrons. These respective layers, each having a thickness of approximately several tens of nanometers, are deposited to form the deposition layer 25 of the organic layers. It should be noted that an electron injection layer, such as LiF or Liq, which improves the electron injection property, may also be provided between the organic layers and the metal electrode.

In the deposition layer 25 of the organic layers, an organic layer of a material corresponding to each color of RGB is deposited as the light emitting layer. In addition, the hole transport layer, the electron transport layer, and other similar layers are preferably deposited separately by using materials suitable for the light emitting layer, if emphasis is placed on light emission performance. However, in consideration of the material cost, the same material common to two or three colors of RGB may be deposited in some cases. In a case where the material common to sub-pixels of two or more colors is deposited, the deposition mask 1 is formed to have opening sections 11a formed in the sub-pixels sharing the common material. When individual sub-pixels to have different deposited layers, for example, one deposition mask 1 is used for sub-pixels of R, so that the respective organic layers can be sequentially deposited. In a case where an organic layer common to RGB is deposited, other organic layers for the respective sub-pixels are deposited up to the lower side of the common layer, and then at the stage of the common organic layer, the common organic layer is deposited across the entire pixels at one time using the deposition mask 1 with the opening sections 11a formed at RGB sites.

After finishing the formation of the deposition layer 25 of all the organic layers and the electron injection layer, such as a LiF layer, as described above, the electromagnet 3 apply a magnetic field to cause the deposition mask 1 to repel the electromagnet 3, thereby easily separating the deposition mask 1. Thereafter, the second electrode (e.g., cathode) 26 is formed over the entire surface. An example illustrated in FIG. 5B is a top emission type, in which light is emitted from a surface opposite to the device substrate 21 illustrated in the figure. Thus, the second electrode 26 may be formed of a light-transmissive material, for example, a thin Mg—Ag eutectic layer. Alternatively, for example, Al may be used. It should be noted that in a bottom emission type which emits light through the device substrate 21, ITO or $In_3O_4$, for example, may be used for the first electrodes 22, and metals having low work functions, for example, Mg, K, Li, or Al may be used for the second electrode 26. A protective layer 27 made of, for example, $Si_3N_4$, is formed on a surface of the second electrode 26. It should be noted that the whole deposited layers are sealed with a sealing layer made of glass or a moisture-resistant resin film (not illustrated), for example, and is thus configured to prevent the deposition layer 25 of the organic layers from absorbing moisture. Alternatively, a structure can also be provided in which the organic layers may be made common or shared as much as possible, and a color filter may be provided on the surface side of the organic layers.

The above deposition mask 1 can be repeatedly used. Once magnetized, the deposition mask 1 can be used without being re-magnetized. However, since the organic material 51 is deposited on a surface of the deposition mask 1 which faces the vapor deposition source, the deposition mask 1 needs to be washed when the organic material 51 is accumulated thereon by approximately 1 μm. If the magnetized deposition mask 1 is washed, magnetic materials contained in a cleaning liquid may absorbed to the deposition mask 1, damaging the deposition mask 1, or particles, such as dust particles, in the air may be absorbed to the deposition mask 1. Therefore, before the washing, the magnetization of the deposition mask 1 may be demagnetized, or a magnetic field may be applied to the deposition mask 1 in the opposite direction to weaken the magnetization. In this case, for example, the deposition mask 1 may be washed with an organic solvent.

REFERENCE SIGNS LIST

1 Deposition mask
2 Substrate for vapor deposition
3 Electromagnet
5 Vapor deposition source
6 Touch plate
7 Magnetic material
11 Resin film
11a Opening section
12 Metal support layer
12a Opening
14 Frame
15 Mask holder
21 Device substrate
22 First electrode
23 Insulating bank
25 Deposition layer
26 Second electrode
27 Protective layer
29 Substrate holder
31 Magnetic core
32 Electromagnetic coil
33 Resin
41 Laser mask
41a Opening section
41b Light-shielding film
42 Optical lens
45 Process stage
61 Support frame

The invention claimed is:
1. A vapor deposition method comprising:
forming a deposition mask having at least partly a metal layer made of a ferromagnetic material;
magnetizing the metal layer of the deposition mask by applying a magnetic field to the metal layer;
aligning the deposition mask and a substrate for vapor deposition with each other, and then attracting and fixing the deposition mask to an electromagnet with the substrate for vapor deposition therebetween;
depositing a vapor deposition material on the substrate for vapor deposition by vaporizing the vapor deposition material in a vapor deposition source, the vapor deposition source being disposed so as to face the deposition mask; and
separating both the electromagnet and the substrate for vapor deposition from the deposition mask by generating a magnetic field to cause the deposition mask to repel from the electromagnet.

2. The vapor deposition method according to claim 1, wherein the electromagnet magnetizes the metal layer of the deposition mask.

3. The vapor deposition method according to claim 1, wherein the electromagnet comprises a plurality of electromagnets, the electromagnets being disposed for the deposition mask, and wherein the separating of both the electromagnet and the substrate for vapor deposition from the deposition mask includes applying a repelling force differently to a center portion and periphery portion of the deposition mask.

4. The vapor deposition method according to claim 3, wherein the repelling force is generated so as to gradually vary from the periphery potion toward the center portion of the deposition mask.

5. The vapor deposition method according to claim 1, further comprising demagnetizing the deposition mask after separating the substrate for vapor deposition from the deposition mask.

6. The vapor deposition method according to claim 1, wherein the electromagnet operates while being cooled down.

7. A method for manufacturing an organic EL display apparatus by depositing organic layers on a device substrate, the method comprising:
   forming the device substrate by forming at least a TFT and a first electrode on a support substrate;
   forming a deposition layer of the organic layers on the device substrate by depositing organic materials on the first electrode with the vapor deposition method according to claim 1; and
   forming a second electrode on the deposition layer.

* * * * *